(12) United States Patent
Sakai et al.

(10) Patent No.: US 7,495,482 B2
(45) Date of Patent: Feb. 24, 2009

(54) SEMICONDUCTOR DEVICE

(75) Inventors: Kenji Sakai, Fukuoka (JP); Yoshikazu Tanaka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/860,123

(22) Filed: Sep. 24, 2007

(65) Prior Publication Data

US 2008/0278215 A1    Nov. 13, 2008

(30) Foreign Application Priority Data

May 7, 2007    (JP)    .............................. 2007-122767

(51) Int. Cl.
*H03B 1/00*    (2006.01)

(52) U.S. Cl. ...................... 327/108; 327/109

(58) Field of Classification Search ........................ None
See application file for complete search history.

(56) References Cited

U.S. PATENT DOCUMENTS

| | | | | |
|---|---|---|---|---|
| 5,917,359 | A * | 6/1999 | Fukunaga et al. ............ | 327/381 |
| 6,353,345 | B1 * | 3/2002 | Yushan et al. ................. | 327/112 |
| 6,486,714 | B2 * | 11/2002 | Ushida et al. ................. | 327/108 |
| 6,529,061 | B1 * | 3/2003 | Orita ............................ | 327/381 |
| 6,531,894 | B2 * | 3/2003 | Watabe ......................... | 326/82 |
| 6,538,481 | B1 * | 3/2003 | Suetsugu ...................... | 327/109 |
| 6,664,822 | B2 * | 12/2003 | Watabe ......................... | 327/108 |
| 6,774,674 | B2 * | 8/2004 | Okamoto et al. .............. | 326/80 |
| 6,967,518 | B2 * | 11/2005 | Giacomini et al. ........... | 327/333 |
| 7,049,850 | B2 * | 5/2006 | Shimizu ....................... | 326/100 |
| 7,236,020 | B1 * | 6/2007 | Virgil ........................... | 327/108 |
| 7,323,912 | B2 * | 1/2008 | Nielsen ........................ | 327/108 |
| 2004/0212021 | A1 * | 10/2004 | Shimizu ....................... | 257/375 |

FOREIGN PATENT DOCUMENTS

JP    9-200017    7/1997

* cited by examiner

*Primary Examiner*—Cassandra Cox
(74) *Attorney, Agent, or Firm*—Oblon, Spivak, McClelland, Maier & Neustadt, P.C.

(57) ABSTRACT

A semiconductor device according to the present invention is a semiconductor device for driving and controlling a power device in the high-potential side of two power devices connected in series between a main power source potential of a high potential and a main power source potential of a low potential, and is equipped with a pulse generating circuit for generating first and second pulse signals corresponding to the level transition to first and second states of input signals having a first state showing the conduction of the power device in the high-potential side and a second state showing the non-conduction of the power device in the high-potential side, respectively; a level shift circuit for obtaining first and second level-shifted pulse signals by level-shifting the first and second pulse signals to the high-potential side; an SR-type flip-flop circuit inputting the first level-shifted pulse signals from set input terminal and the second level-shifted pulse signals from reset input terminal; and a delay circuit for delaying the output of the SR-type flip-flop circuit by at least the pulse width of the first and second pulse signals.

9 Claims, 16 Drawing Sheets

SEMICONDUCTOR DEVICE

BACKGROUND OF THE INVENTION

1. Field of the Invention

The present invention relates to a semiconductor device that drives and controls a high-potential-side power device of two power devices connected in series between a main power source potential of a high potential and a main power source potential of a low potential, and specifically, to a semiconductor device that can prevent the malfunction of power devices.

2. Background Art

FIG. 14 is a circuit diagram showing a half bridge circuit. Power devices 101 and 102, such as IGBT (insulated gate bipolar transistor), are totem-pole-connected between the positive pole and the negative pole (grounding potential, GND) of the power source PS. To power devices 101 and 102, free-wheel diodes D1 and D2 are connected in inverse-parallel, respectively. A load (inductive load, such as a motor) 103 is connected to the connecting point N1 of the power device 101 and the power device 102.

The power device 101 is a device that makes the potential at the connecting point N1 with the power device 102 a reference potential and performs switching operation between the reference potential and the power-source potential supplied by the power source PS, and is called a high-potential-side power device. On the other hand, the power device 102 that makes grounding potential a reference potential and performs switching operation between the reference potential and the potential of the connecting point N1, and is called a low-potential-side power device.

The power device 101 is driven by the high-potential-side power device driving circuit HD, and the power device 102 is driven by the low-potential-side power device driving circuit LD. To the high-potential-side power device driving circuit HD, a voltage VB of the anode of the high-potential-side power source 104 (high-potential-side floating power source absolute voltage) and a voltage VS of the cathode of the high-potential-side power source 104 (high-potential-side floating power source offset voltage) are supplied. The high-potential-side power device driving circuit HD outputs output signals HO to the gate electrode of the power device 102. Since the low-potential-side power device driving circuit LD is little related to the present invention, the description thereof will be omitted.

FIG. 15 is a circuit diagram showing a conventional semiconductor device. The semiconductor device is a high-potential-side power device driving circuit that drives and controls the high-potential-side power device of the two power devices connected between the main power source potential having high potential and the main power source potential having low potential in series.

Input signals HIN are given from an externally provided microcomputer or the like. Input signals HIN have "H (high potential)" (first state) that shows the conduction of a power device in the high-potential side, and "L (low potential)" (second state) that shows the non-conduction of a power device in the high-potential side.

A pulse generating circuit 11 generates pulsing ON signals (first pulse signals) and OFF signals (second pulse signals) corresponding to the level transition to "H" and "L" of input signals HIN, respectively.

The two outputs of the pulse generating circuit 11 are connected to gate electrodes of high breakdown voltage N-channel field effect transistors (hereafter referred to as HNMOS transistors) 12 and 13, which are level shift transistors, respectively. ON signals are given to the gate electrode of the HNMOS transistors 12, and OFF signals are given to the gate electrode of the HNMOS transistors 13. The drain electrodes of the HNMOS transistors 12 and 13 are connected to an end of each of resistors 14 and 15, and also connected to input terminals of inverters 16 and 17, respectively.

A level shift circuit is composed of the HNMOS transistors 12 and 13, resistors 14 and 15, and inverters 16 and 17. The level shift circuit shifts the levels of ON signals and OFF signals toward the high-potential side to obtain first and second level-shifted pulse signals, respectively.

An SR-type flip-flop circuit 19 inputs the output signals of the inverters 16 and 17 (first and second level-shifted pulse signals) via a protective circuit 18 from the set input terminal S and reset input terminal R, respectively. Here, the protective circuit 18 is a filter circuit for preventing the malfunction of the SR-type flip-flop circuit 19, and is composed of a logic gate.

The output terminal Q of the SR-type flip-flop circuit 19 is connected to the gate electrode of an NMOS transistor 20, and also connected to the input of the inverter 21. The output of the inverter 21 is connected to the gate electrode of an NMOS transistor 22. The voltage of the connecting point of the NMOS transistors 20 and 22 is outputted as an output signal HO in the high-potential side. By thus complementarily turning the NMOS transistors 20 and 22 ON and OFF, the power device 101 is switched.

The other ends of the resistors 14 and 15 are connected to the drain electrode side of the NMOS transistor 20, and a voltage VB is supplied. The source electrode of the NMOS transistor 22 is connected to the anodes of diodes 23 and 24 and the connecting point N1 shown in FIG. 14, and a voltage VS is supplied. The cathodes of the diodes 23 and 24 are connected to the drain electrodes of the HNMOS transistors 12 and 13, respectively.

Next, the operation of a conventional high-potential-side power device driving circuit will be described referring to the timing chart shown in FIG. 16.

First, the pulse generating circuit 11 generates pulse ON signals that transit to "H (high potential)" corresponding to the rise of input signals HIN. By the ON signals, the HNMOS transistor 12 is turned ON. At this time, OFF signals are in "L (low potential)", and the HNMOS transistor 13 is in the OFF state.

Thereby, voltage drop occurs in the resistor 14 connected to the HNMOS transistor 12, and "L" signals are inputted into the inverter 16. On the other hand, since no voltage drop occurs in the resistor 15 connected to the HNMOS transistor 13, "H" signals are continuously inputted into the inverter 17. Therefore, the output signals from the inverter 16 become pulse signals that transit to "H", and the output signals from the inverter 17 are maintained in the "L" state.

Then, the protective circuit 18 that has received output signals from inverters 16 and 17 outputs pulse signals that transit to "L" corresponding to the output signals from the inverter 16 into the set input terminal S of the SR-type flip-flop circuit 19. On the other hand, the protective circuit 18 outputs "H" signals corresponding to the output signals from the inverter 17 into the reset input terminal R of the SR-type flip-flop circuit 19.

The pulse generating circuit 11 generates pulse OFF signals that transit to "H (high potential)" corresponding to the fall of input signals HIN. In this case, the protective circuit 18 also performs the same operation as described above, and outputs "H" signals corresponding to the output signals from the inverter 16 into the set input terminal S of the SR-type flip-flop circuit 19. On the other hand, the protective circuit 18 outputs pulse signals that transit to "L" corresponding to the output signals from the inverter 17 into the reset input terminal R of the SR-type flip-flop circuit 19.

As a result, the output terminal Q of the SR-type flip-flop circuit 19 transits to "H" in the timing when ON signals are given, and transits to "L" in the timing when OFF signals are given. Furthermore, output signals HO obtained by complementarily turning the NMOS transistors 20 and 22 ON and OFF also become the same sort of signals.

A problem that arises here is dv/dt transient signals generated in the line from the connecting point N1 to the anodes of diodes 23 and 24 depending on the switching state of the half-bridge-type power device composed of power devices 101 and 102.

If dv/dt transient signals are generated, a dv/dt current obtained by the product of a parasitic static capacitance between the drains and sources of the HNMOS transistors 12 and 13 and the dv/dt transient signals simultaneously flows in the HNMOS transistors 12 and 13. Thereby, erroneous pulse by the dv/dt transient signals is simultaneously given instead of ON signals and OFF signals. In such a case, the protective circuit 18 is constituted so as to prevent simultaneous signal input into the SR-type flip-flop circuit 19 (for example, refer to Japanese Patent Application Laid-Open No. 9-200017).

SUMMARY OF THE INVENTION

When the output signals HO of the high-potential-side power-device driving circuit HD are "H", the power device 101 is turned ON, and the current 11 flows as shown in FIG. 14. Thereafter, when the output signals HO of the high-potential-side power-device driving circuit HD transit from "H" to "L", and the power device 101 is switched from "ON" to "OFF", a reflux mode wherein current 12 flows in the freewheel diode D2 is established. At this time, the voltage VS temporarily becomes lower than GND to a negative voltage by the dv/dt transient signals and the inductance of wirings.

In conventional semiconductor devices, On signals or OFF signals are outputted at the same time of switching the power device 101. However, when the voltage VS becomes negative by switching the power device 101, the HNMOS transistor 12 is turned OFF and the HNMOS transistor 13 is turned ON by the On signals and OFF signals creating an imbalanced state. Therefore, difference in the recovery voltages flowing in the parasitic diodes 25 and 26 of the HNMOS transistors 12 and 13 is caused. Thereby, erroneous output signals HO are outputted, causing the malfunction of power devices.

To solve problems as described above, an object of the present invention is to provide a semiconductor device that can prevent the malfunction of a power device.

According to one aspect of the present invention, a semiconductor device for driving and controlling a power device in the high-potential side of two power devices connected in series between a main power source potential of a high potential and a main power source potential of a low potential, comprising: a pulse generating circuit for generating first and second pulse signals corresponding to the level transition to first and second states of input signals having a first state showing the conduction of said power device in the high-potential side and a second state showing the non-conduction of said power device in the high-potential side, respectively; a level shift circuit for obtaining first and second level-shifted pulse signals by level-shifting said first and second pulse signals to the high-potential side; an SR-type flip-flop circuit inputting said first level-shifted pulse signals from set input terminal and said second level-shifted pulse signals from reset input terminal; and a delay circuit for delaying the output of said SR-type flip-flop circuit by at least the pulse width of said first and second pulse signals.

According to the present invention, the malfunction of a power device can be prevented.

DETAILED DESCRIPTION OF THE PREFERRED EMBODIMENTS

First Embodiment

Figure 1:
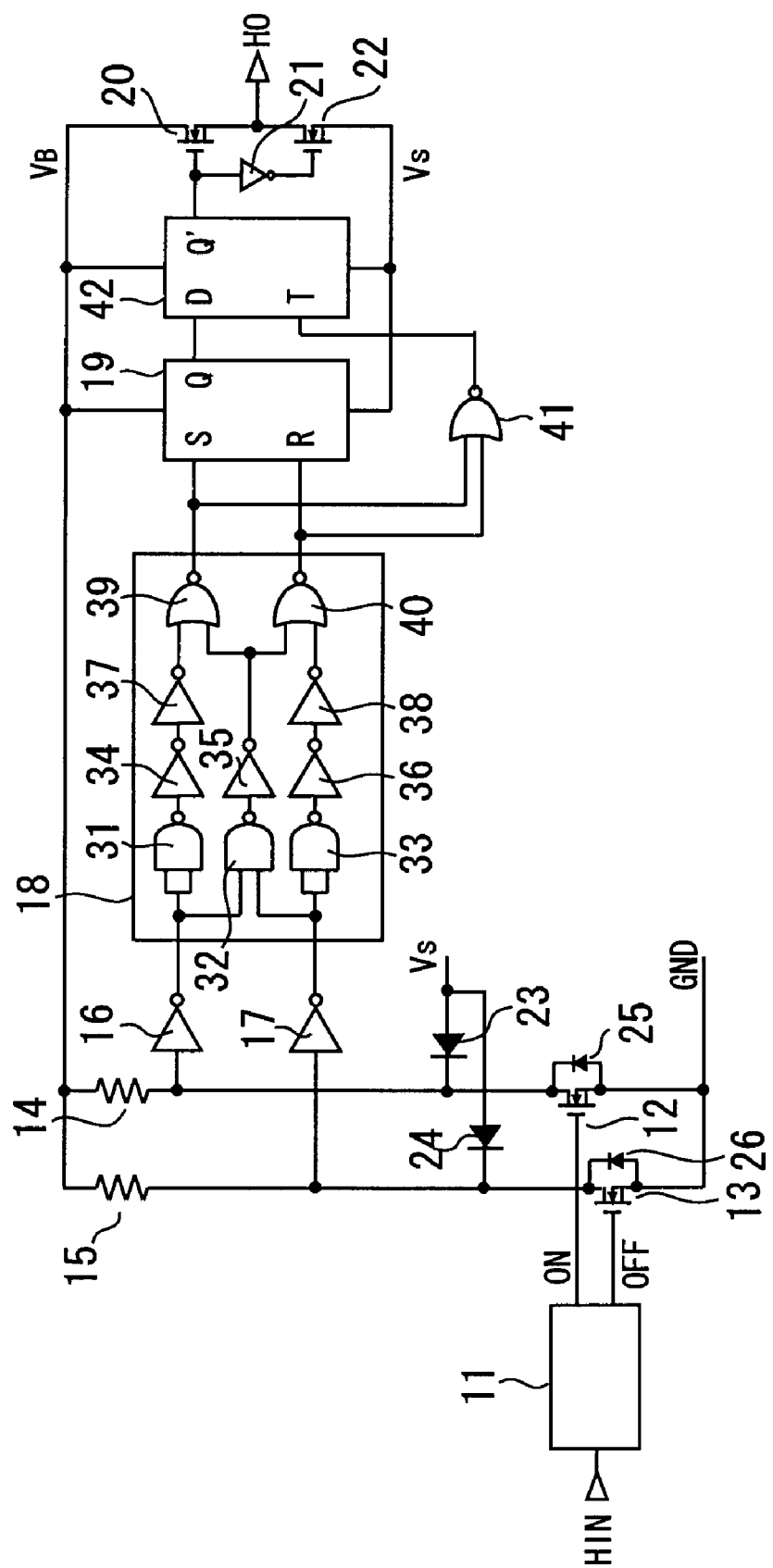
FIG. 1 is a circuit diagram showing a semiconductor device according to the first embodiment of the present invention.

FIG. 1 is a circuit diagram showing a semiconductor device according to the first embodiment of the present invention. The semiconductor device is a high-potential side power device driving circuit for driving and controlling a power device in the high-potential side of two power devices connected in series between a main power source potential of a high potential and a main power source potential of a low potential.

Input signals HIN are given from an externally provided microcomputer or the like. Input signals HIN have "H (high potential)" (first state) that shows the conduction of a power device in the high-potential side, and "L (low potential)" (second state) that shows the non-conduction of a power device in the high-potential side.

A pulse generating circuit 11 generates pulsing ON signals (first pulse signals) and OFF signals (second pulse signals) corresponding to the level transition to "H" and "L" of input signals HIN, respectively.

The two outputs of the pulse generating circuit 11 are connected to gate electrodes of high breakdown voltage N-channel field effect transistors (hereafter referred to as HNMOS transistors) 12 and 13, which are level shift transistors, respectively. ON signals are given to the gate electrode of the HNMOS transistors 12, and OFF signals are given to the gate electrode of the HNMOS transistors 13. The drain electrodes of the HNMOS transistors 12 and 13 are connected to an end of each of resistors 14 and 15, and also connected to input terminals of inverters 16 and 17, respectively.

A level shift circuit is composed of the HNMOS transistors 12 and 13, resistors 14 and 15, and inverters 16 and 17. The level shift circuit shifts the levels of ON signals and OFF signals toward the high-potential side to obtain first and second level-shifted pulse signals, respectively.

An SR-type flip-flop circuit 19 inputs the output signals of the inverters 16 and 17 (first and second level-shifted pulse signals) via a protective circuit 18 from the set input terminal S and reset input terminal R, respectively. Here, the protective circuit 18 is a filter circuit for preventing the malfunction of the SR-type flip-flop circuit 19, and is composed of NAND circuits 31 to 33, inverters 34 to 38, and NOR circuits 39 and 40.

The NOR circuits 41 inputs the first and second level-shifted pulse signals and performs NOR operation. A D-type flip-flop circuit 42 inputs the output of the NOR circuit 40 from the clock input T, and inputs the output of the SR-type flip-flop circuit 19 from the data input D. A delay circuit is composed of the NOR circuits 41 and the D-type flip-flop circuit 42. The delay circuit delays the output of the SR-type flip-flop circuit 19 by at least the pulse width of the ON signals and OFF signals.

The output terminal Q' of the D-type flip-flop circuit 42 is connected to the gate electrode of an NMOS transistor 20, and also connected to the input of the inverter 21. The output of the inverter 21 is connected to the gate electrode of an NMOS transistor 22. The voltage of the connecting point of the NMOS transistors 20 and 22 is outputted as an output signal HO. By thus complementarily turning the NMOS transistors 20 and 22 ON and OFF, the power device in the high-potential side is switched.

Figure 14:
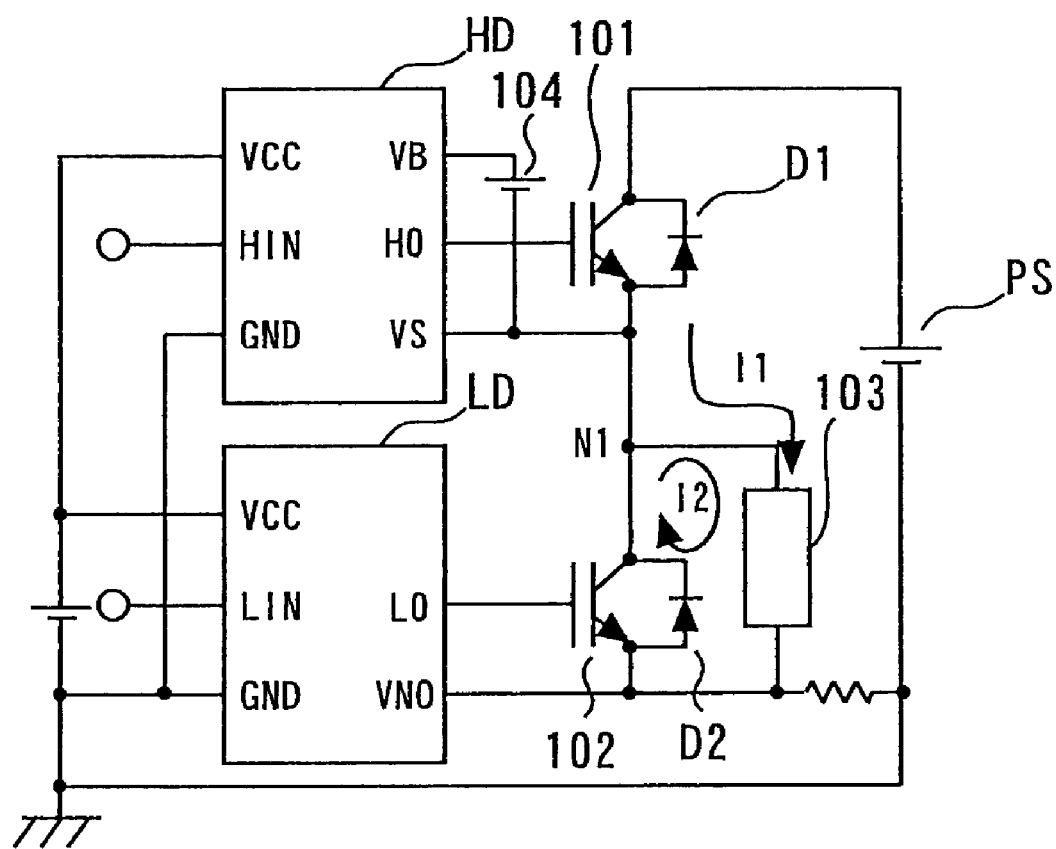
FIG. 14 is a circuit diagram showing a half bridge circuit.
Figure 15:
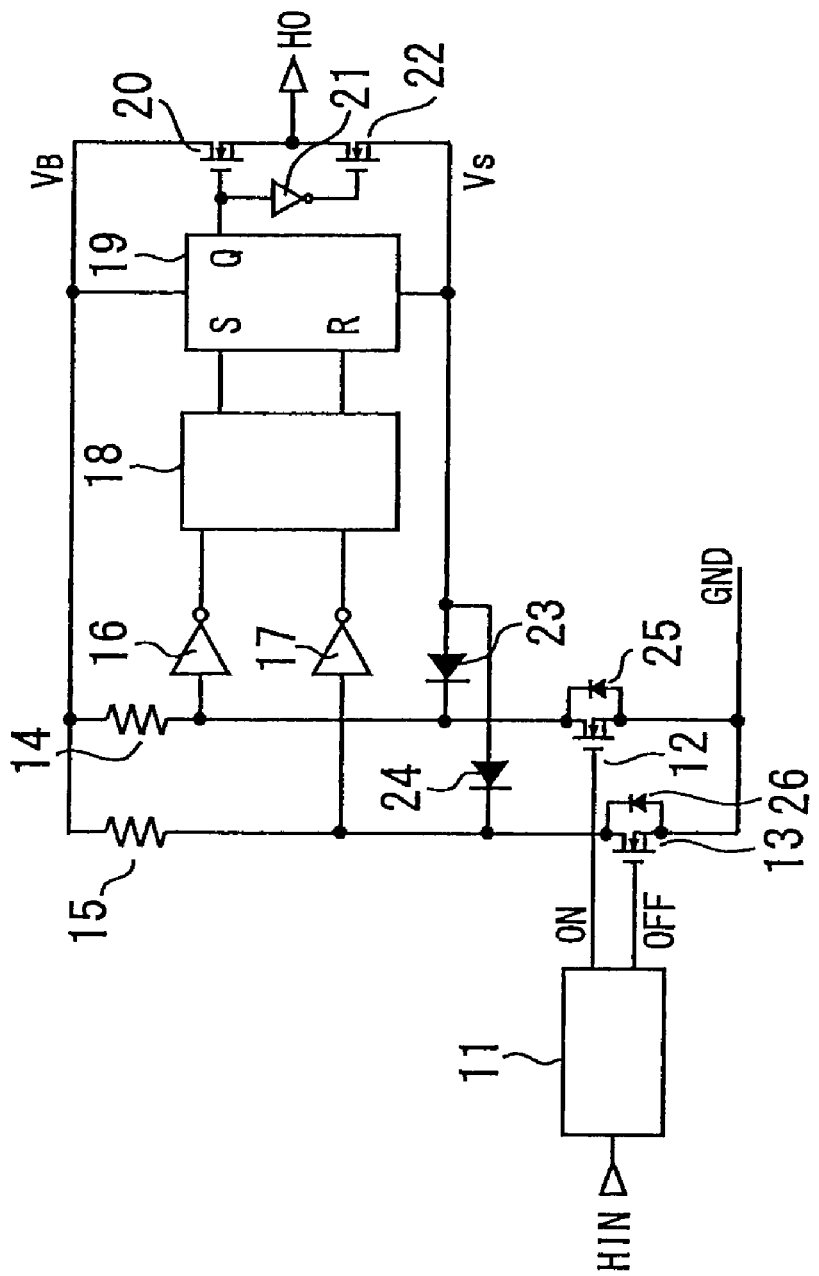
FIG. 15 is a circuit diagram showing a conventional semiconductor device.
Figure 16:
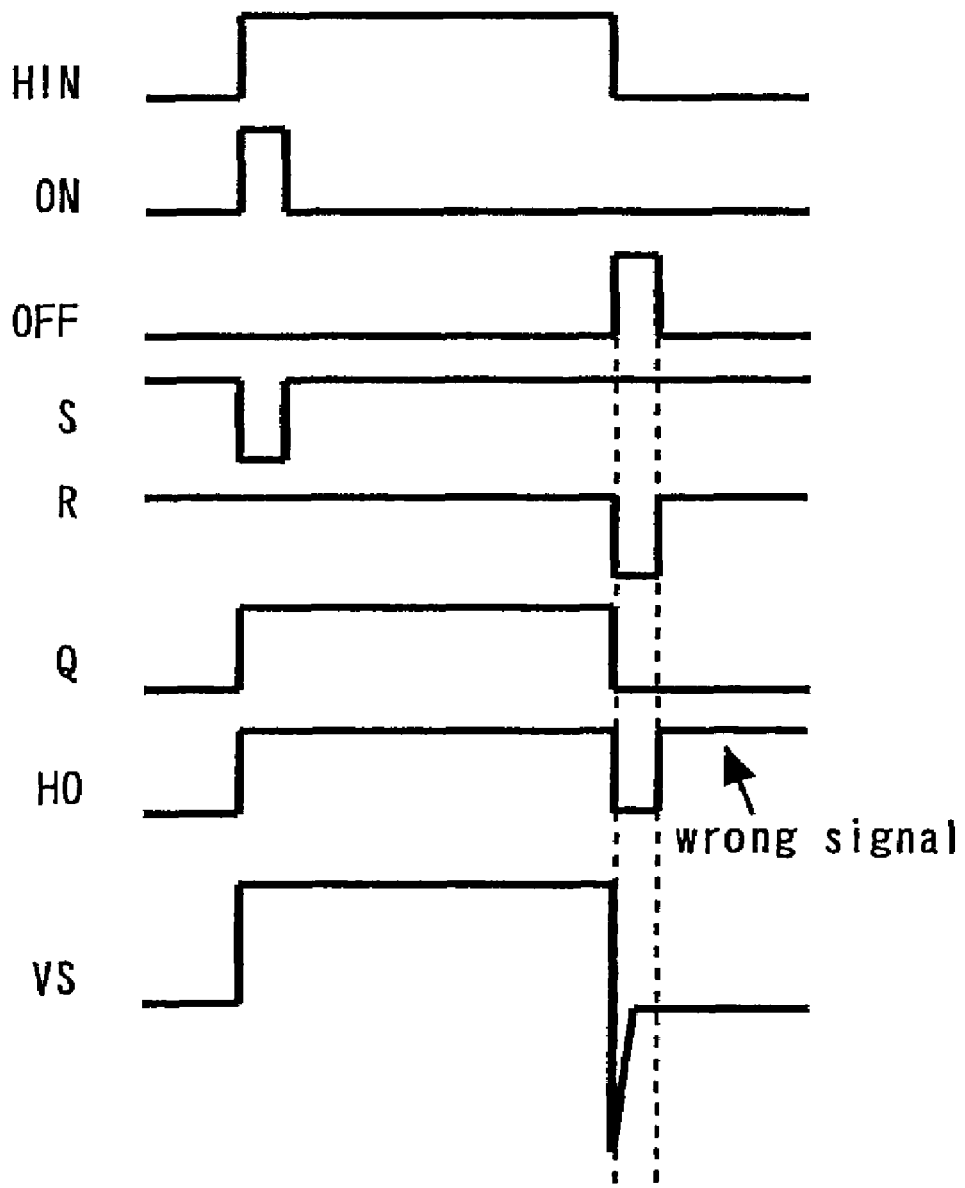
FIG. 16 is a timing chart for illustrating the operation of a conventional semiconductor device.

The other ends of the resistors 14 and 15 are connected to the drain electrode side of the NMOS transistor 20, and a voltage VB is supplied. The source electrode of the NMOS transistor 22 is connected to the anodes of diodes 23 and 24 and the connecting point N1 shown in FIG. 14, and a voltage VS is supplied. The cathodes of the diodes 23 and 24 are connected to the drain electrodes of the NMOS transistors 12 and 13, respectively.

Figure 2:
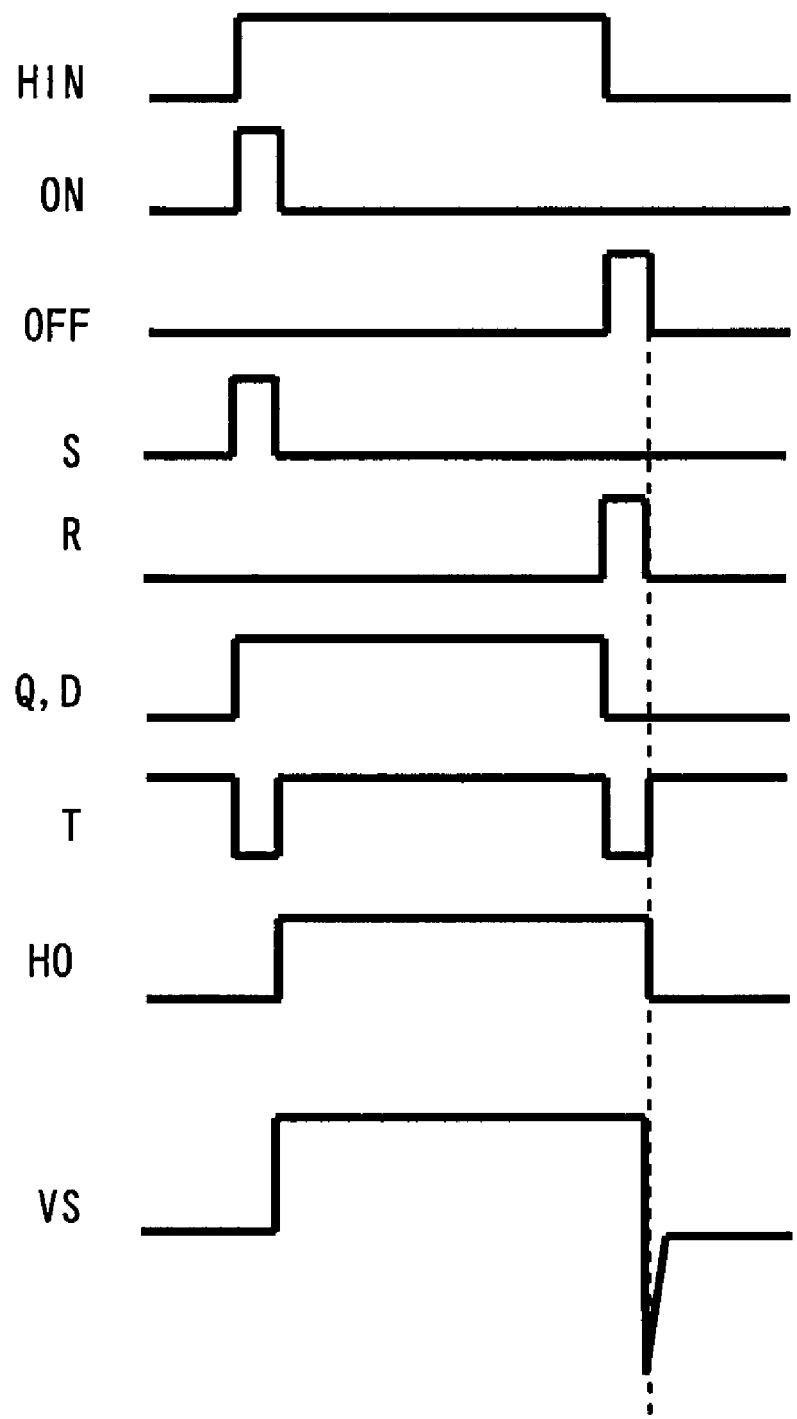
FIG. 2 is a timing chart for illustrating the operation of a semiconductor device according to the first embodiment of the present invention.

FIG. 2 is a timing chart for illustrating the operation of a semiconductor device according to the first embodiment of the present invention. As FIG. 2 shows, the output signal HO is switched after the ON signal and the OFF signal are outputted. Thereby, when the voltage VS is negative by switching the power device, the ON signal and the OFF signal are not outputted. Therefore, the malfunction of the power device can be prevented. Also since the output of the SR-type flip-flop circuit 19 is logically delayed, element fluctuation is reduced.

Second Embodiment

Figure 3:
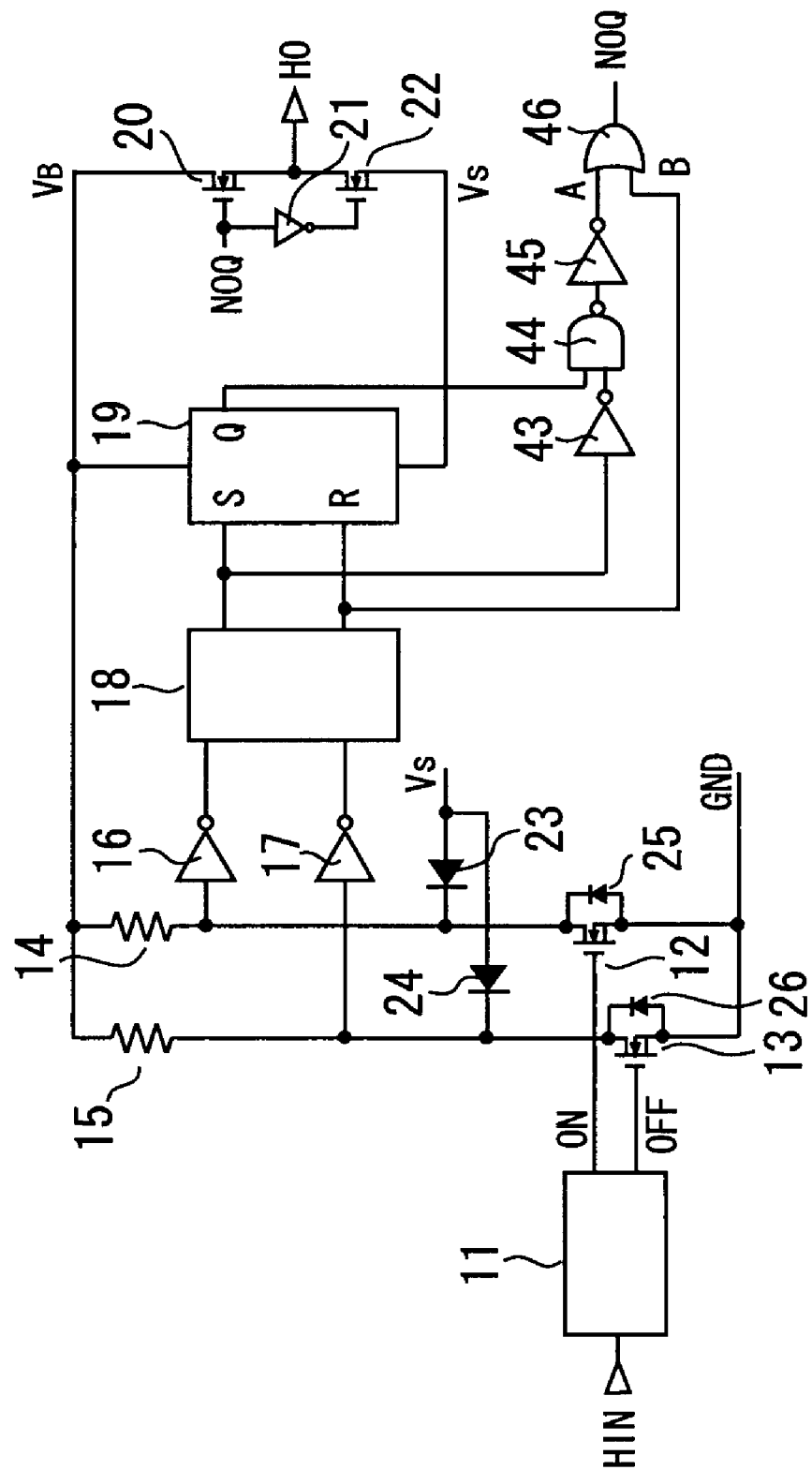
FIG. 3 is a circuit diagram showing a semiconductor device according to the second embodiment of the present invention.
Figure 4:
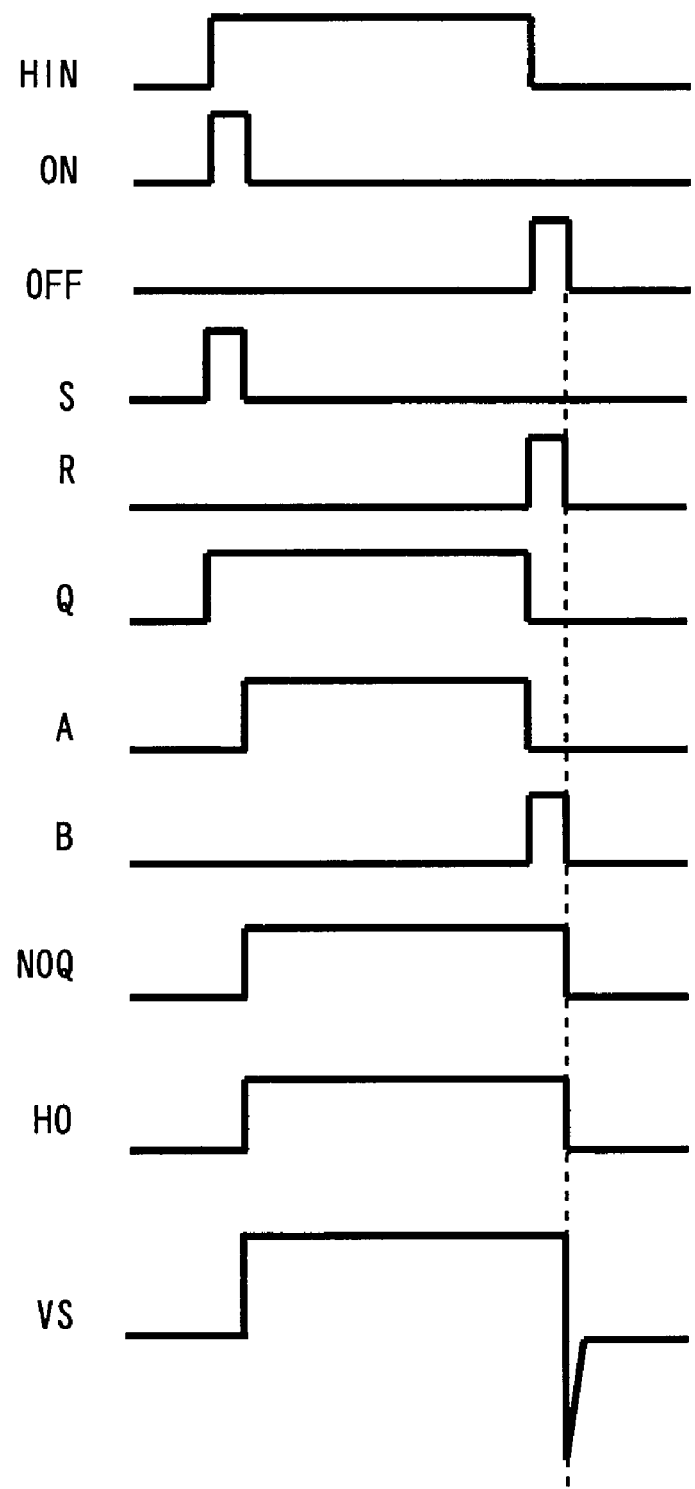
FIG. 4 is a timing chart for illustrating the operation of a semiconductor device according to the second embodiment of the present invention.

FIG. 3 is a circuit diagram showing a semiconductor device according to the second embodiment of the present invention; and FIG. 4 is a timing chart for illustrating the operation thereof.

In the second embodiment, the semiconductor device has a first inverter 43, a NAND circuit 44, a second inverter 45, and an OR circuit 46 as a delay circuit. Other structures are the same as those in the first embodiment.

The first inverter 43 inverts first level-shifted pulse signals. The NAND circuit 44 inputs the output of the first inverter 43 and the output of the SR-type flip-flop circuit 19, and performs NAND operation. The second inverter 45 inverts the output of the NAND circuit 44. The OR circuit 45 inputs the output of the second inverter 45 and the second level-shifted pulse signals, and performs OR operation.

This configuration exerts the effect equal to the effect of the first embodiment. In addition, the circuit scale can be smaller than the first embodiment.

Third Embodiment

Figure 5:
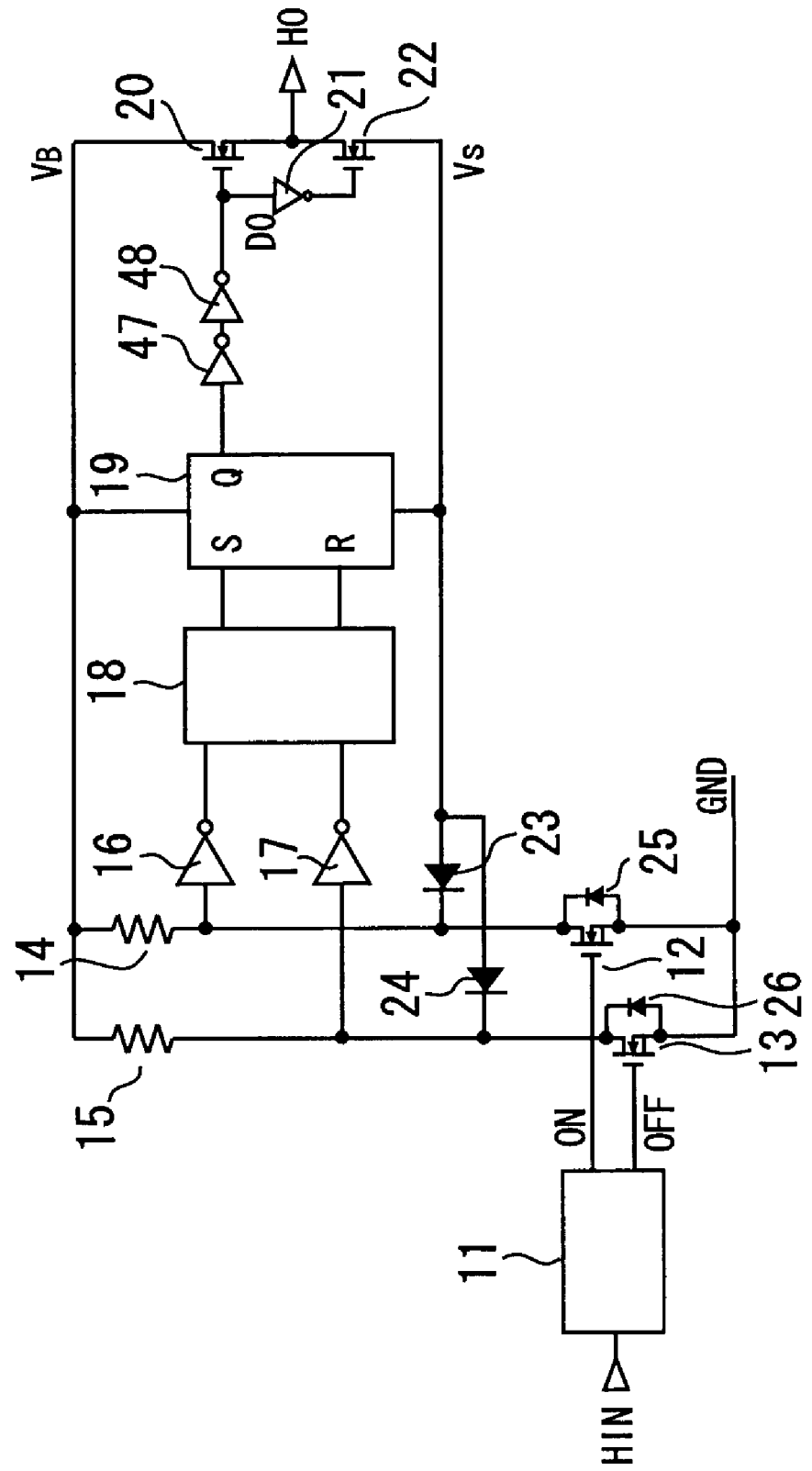
FIG. 5 is a circuit diagram showing a semiconductor device according to the third embodiment of the present invention.
Figure 6:
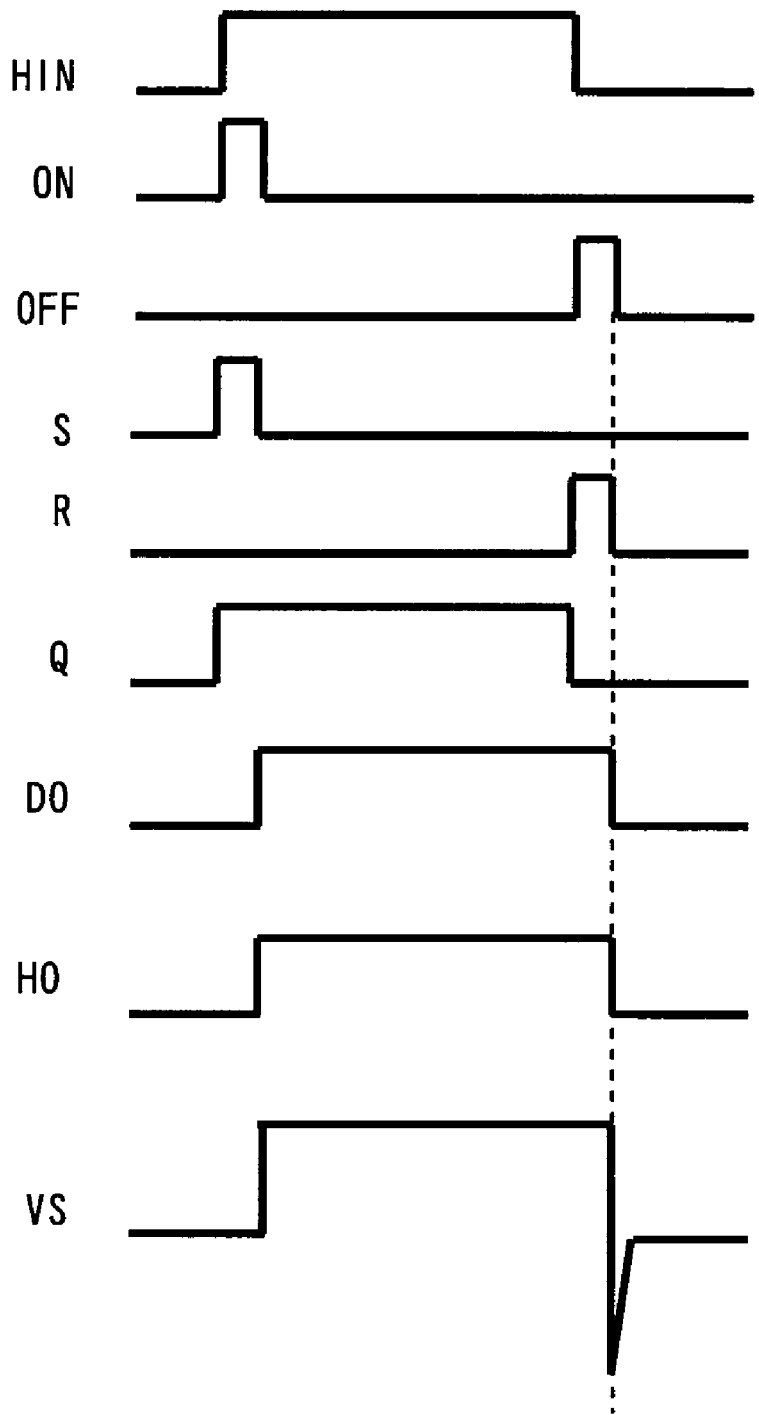
FIG. 6 is a timing chart for illustrating the operation of a semiconductor device according to the third embodiment of the present invention.

FIG. 5 is a circuit diagram showing a semiconductor device according to the third embodiment of the present invention; and FIG. 6 is a timing chart for illustrating the operation thereof.

In the third embodiment, the semiconductor device has a plurality of inverters 47 and 48 as a delay circuit. Other structures are the same as those in the first embodiment. By this configuration, the malfunction of the power device can be prevented in the same manner as in the first embodiment. In addition, the amount of delay can be easily controlled by the number of inverters.

Fourth Embodiment

Figure 7:
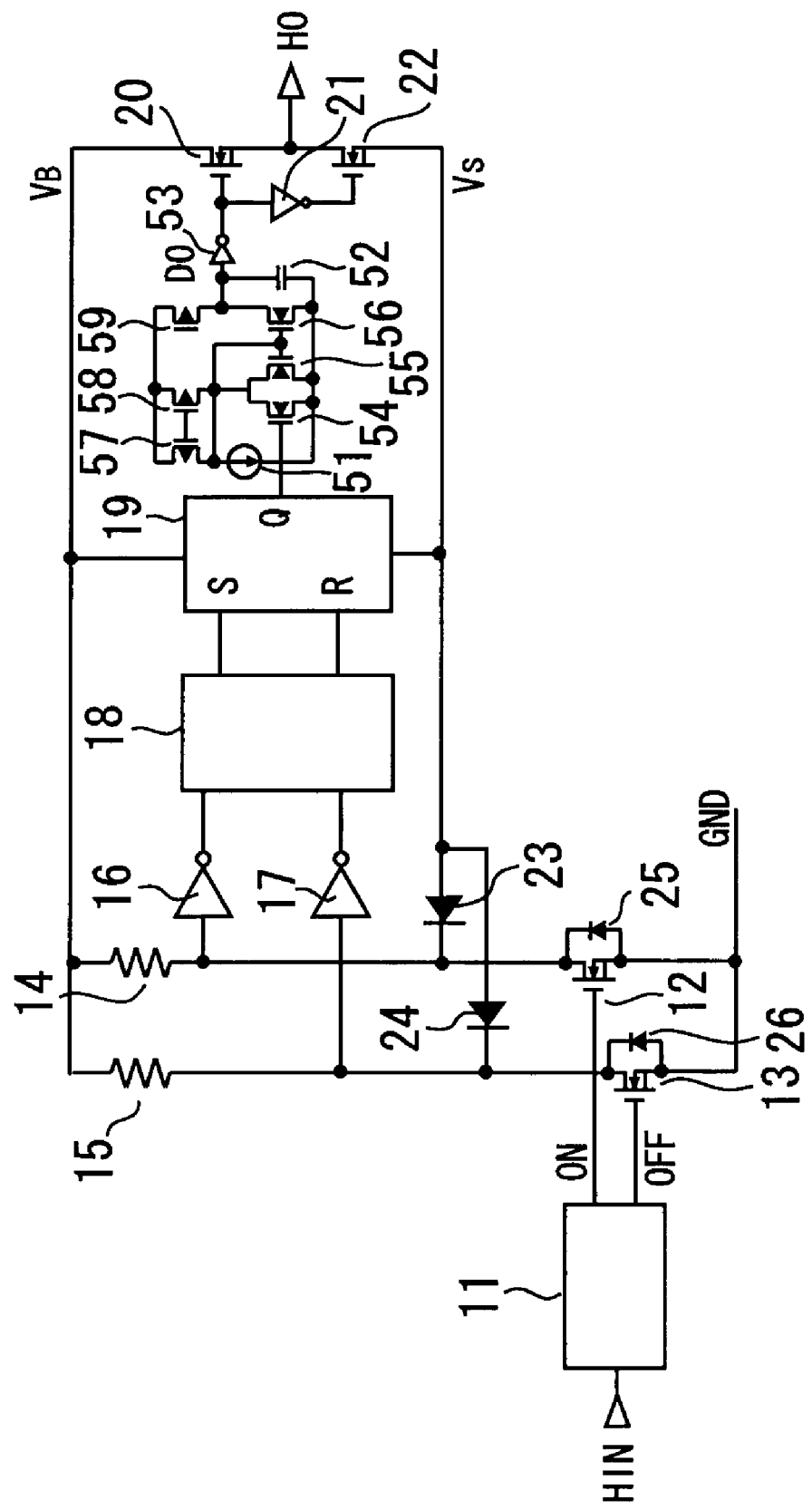
FIG. 7 is a circuit diagram showing a semiconductor device according to the fourth embodiment of the present invention.
Figure 8:
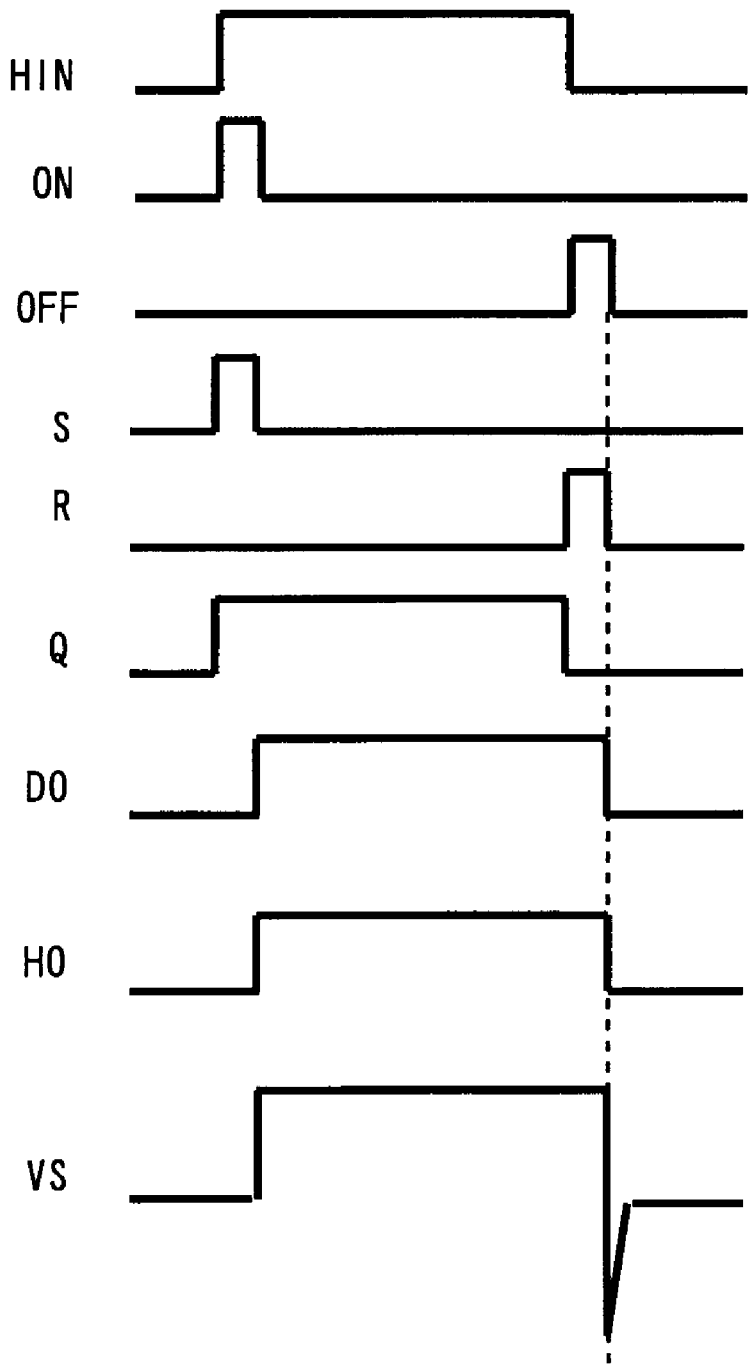
FIG. 8 is a timing chart for illustrating the operation of a semiconductor device according to the fourth embodiment of the present invention.

FIG. 7 is a circuit diagram showing a semiconductor device according to the fourth embodiment of the present invention; and FIG. 8 is a timing chart for illustrating the operation thereof.

In the fourth embodiment, the semiconductor device has a constant current source 51, a capacitor 52, an inverter 53, NMOS transistors 54 to 56, and PMOS transistors 57 to 59 as a delay circuit. Other structures are the same as those in the first embodiment.

The constant current source 51 charges the capacitor 52. NMOS transistors 54 to 56 and PMOS transistors 57 to 59, which are switching elements charge and discharge the capacitor 52 corresponding the output of the SR-type flip-flop circuit 19. The inverter 53 inverts and outputs the voltage charged in the capacitor 52.

By this configuration, the malfunction of the power device can be prevented in the same manner as in the first embodiment. In addition, the amount of delay can be easily controlled by the current value of the constant current source 51 or the capacitance value of the capacitor 52.

Fifth Embodiment

Figure 9:
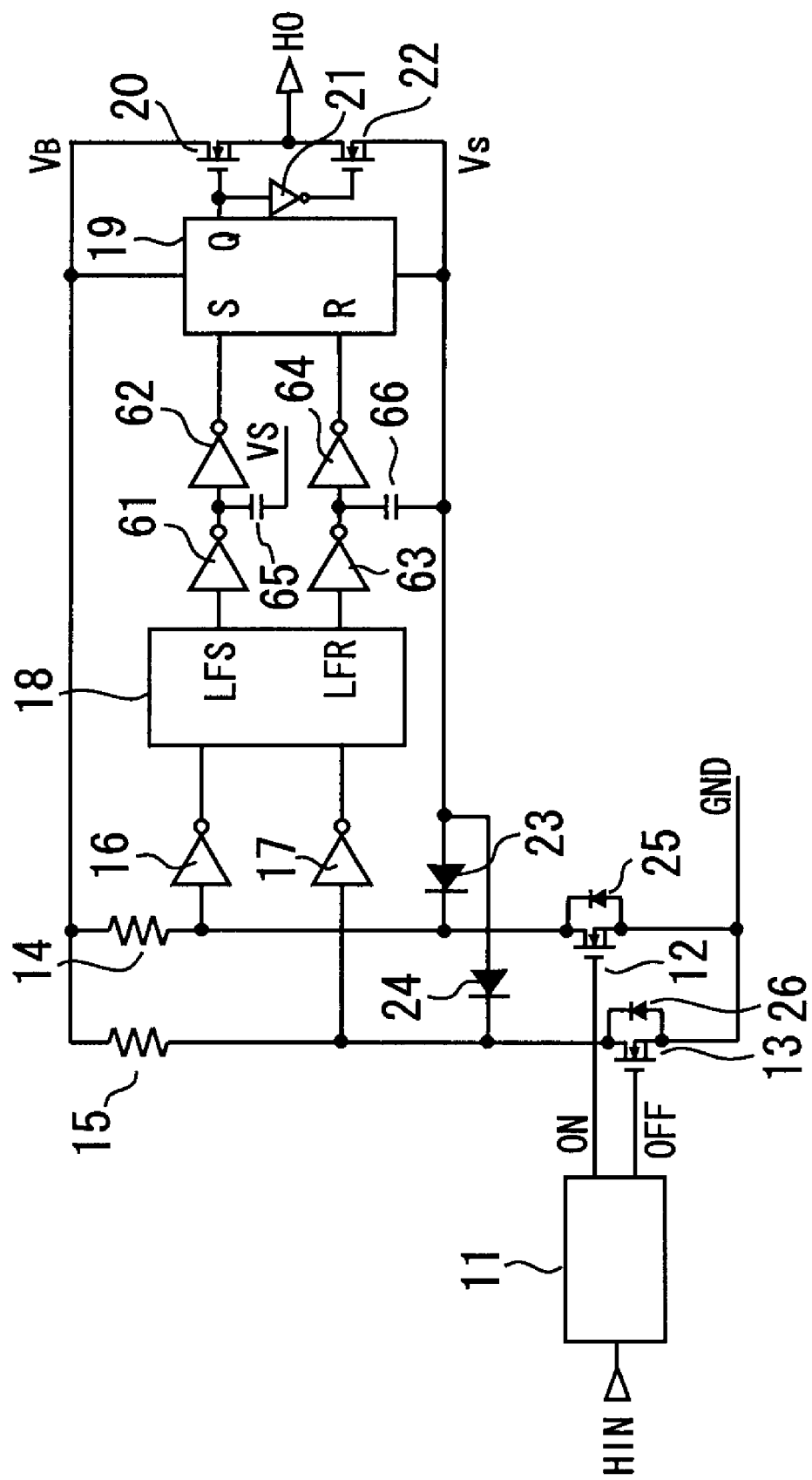
FIG. 9 is a circuit diagram showing a semiconductor device according to the fifth embodiment of the present invention.

FIG. 9 is a circuit diagram showing a semiconductor device according to the fifth embodiment of the present invention. In the above-described first to fourth embodiments, a delay circuit is provided in the subsequent stage of the SR-type flip-flop circuit 19. While in the fifth embodiment, a delay circuit is provided between a protective circuit 18 and an SR-type flip-flop circuit 19. Other structures are the same as those in the first embodiment.

Inverters 61 to 64 and first and second capacitors 65 and 66 are provided as delay circuits. Inverters 61 and 62 are connected in series between the output LFS of a protective circuit 18 and the set input terminal S of the SR-type flip-flop circuit 19. Inverters 63 and 64 are connected in series between the output LFR of the protective circuit 18 and the reset input terminal R of the SR-type flip-flop circuit 19. An end of the first capacitor 65 is connected to the connecting point of the inverter 61 and the inverter 62, and first level-shifted pulse signals are supplied. An end of the second capacitor 66 is connected to the connecting point of the inverter 63 and the inverter 64, and second level-shifted pulse signals are supplied. Voltage VS is supplied to the other ends of the first and second capacitors 65 and 66.

The delay circuit delays the first and second level-shifted pulse signals by at least the pulse width of ON signals and OFF signals to obtain first and second delayed pulse signals. Specifically, voltages charged in the first and second capacitors 65 and 66 are outputted as first and second delayed pulse signals. The SR-type flip-flop circuit 19 inputs the first delayed pulse signals from the set input terminal S, and the second delayed pulse signals from the reset input terminal R.

The output terminal Q of the SR-type flip-flop circuit 19 is connected to the gate electrode of an NMOS transistor 20, and also connected to the input of the inverter 21. The output of the inverter 21 is connected to the gate electrode of an NMOS transistor 22. The voltage of the connecting point of the NMOS transistors 20 and 22 is outputted as an output signal HO in the high-potential side. By thus complementarily turning the NMOS transistors 20 and 22 ON and OFF, the power device in the high-potential side is switched.

Figure 10:
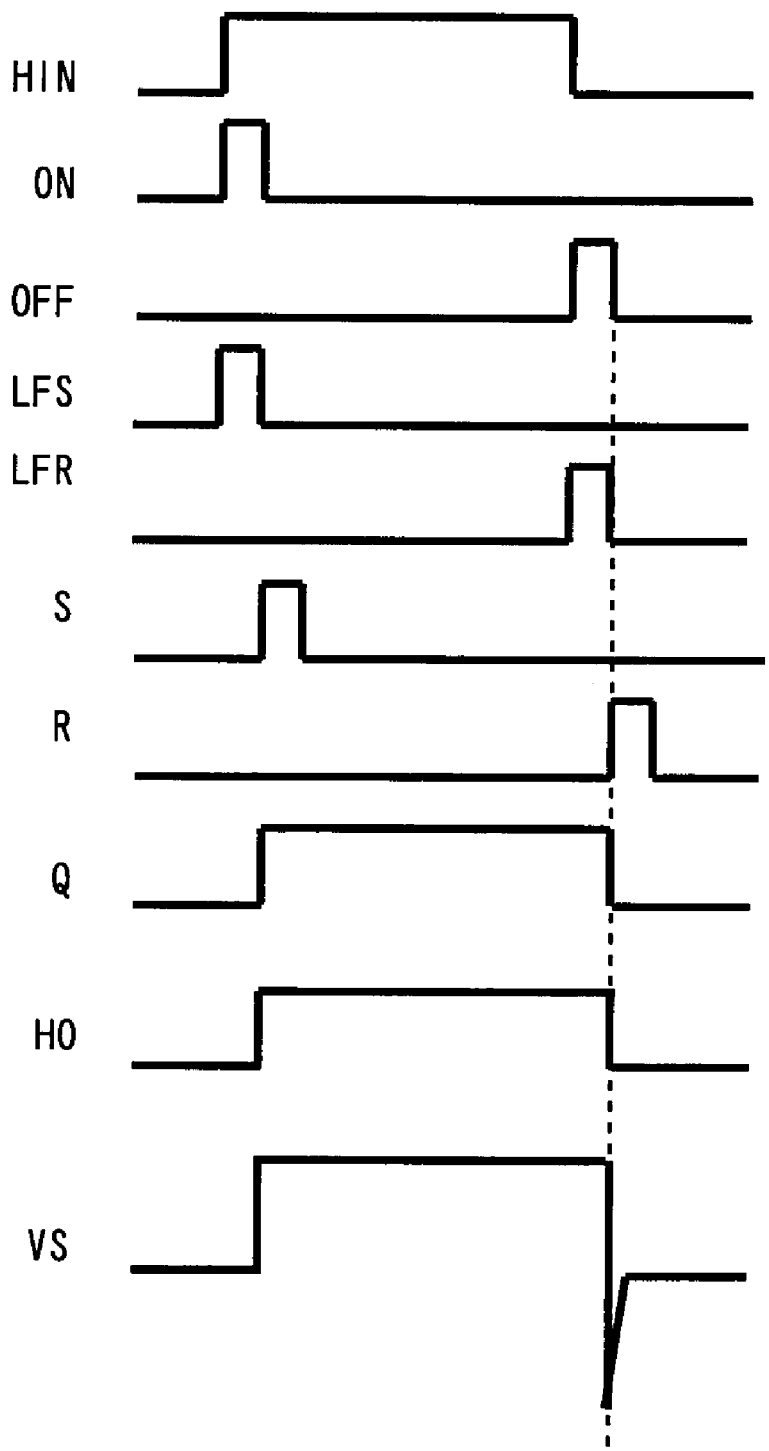
FIG. 10 is a timing chart for illustrating the operation of a semiconductor device according to the fifth embodiment of the present invention.

FIG. 10 is a timing chart for illustrating the operation of a semiconductor device according to the fifth embodiment of the present invention. As FIG. 10 shows, the output signal HO is switched after the ON signal and the OFF signal are outputted. Thereby, when the voltage VS is negative by switching the power device, the ON signal and the OFF signal are not outputted. Therefore, the malfunction of the power device can be prevented. Also, the delay amount of the ON signal and the OFF signal can be independently controlled. In addition, the delay amount can be easily controlled by the capacitance values of the first and second capacitors 65 and 66.

Sixth Embodiment

Figure 11:
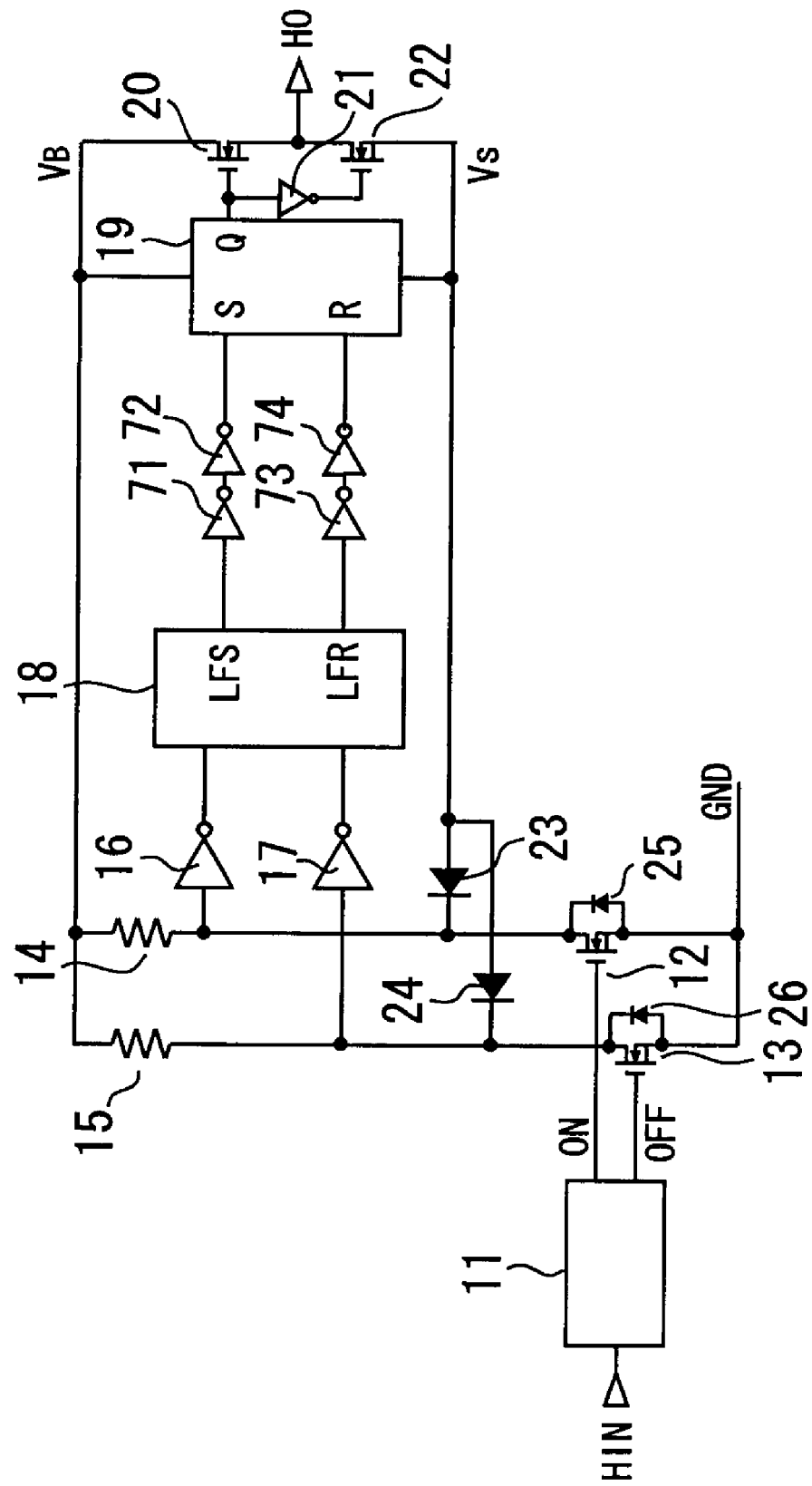
FIG. 11 is a circuit diagram showing a semiconductor device according to the sixth embodiment of the present invention.

FIG. 11 is a circuit diagram showing a semiconductor device according to the sixth embodiment of the present invention. The timing chart of the semiconductor device is the same as the timing chart for the fifth embodiment.

The sixth embodiment is equipped with a plurality of first inverters 71 and 72 connected in series between the output LFS of the protective circuit 18 and the set input terminal S of the SR-type flip-flop circuit 19, and a plurality of second inverters 73 and 74 connected in series between the output LFR of the protective circuit 18 and the reset input terminal R of the SR-type flip-flop circuit 19 as a delay circuit. Other structures are the same as those in the fifth embodiment.

By this configuration, the malfunction of a power device can be prevented in the same manner as in the fifth embodiment, and the delay amount of each of ON signals and OFF signals can be controlled. Furthermore, the delay amount of signals can be easily controlled by the number of stages of the first and second inverters.

Seventh Embodiment

Figure 12:
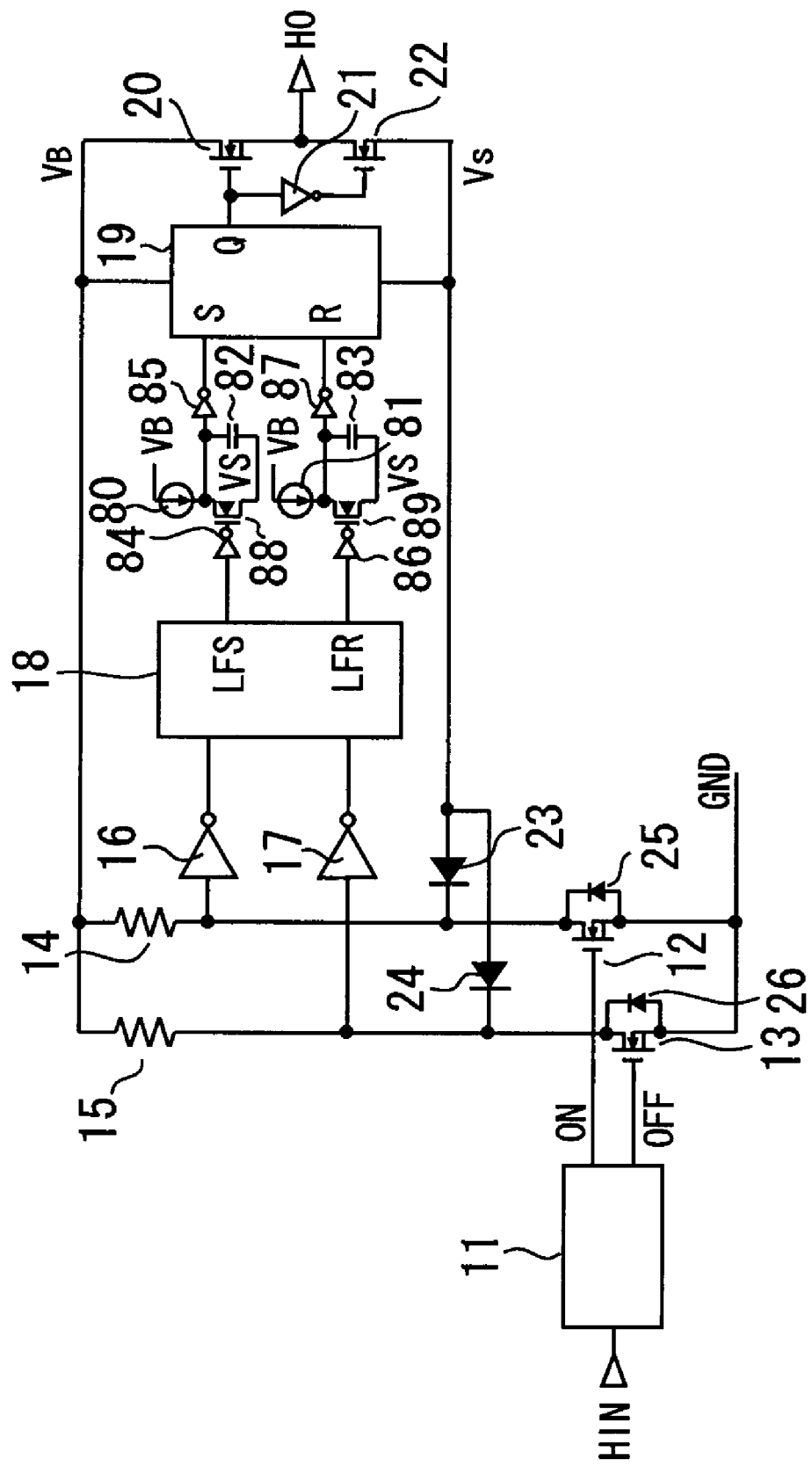
FIG. 12 is a circuit diagram showing a semiconductor device according to the seventh embodiment of the present invention.

FIG. 12 is a circuit diagram showing a semiconductor device according to the seventh embodiment of the present invention. The timing chart of the semiconductor device is the same as the timing chart for the fifth embodiment.

The seventh embodiment has first and second constant current sources 80 and 81, first and second capacitors 82 and 83, inverters 84 to 87, and NMOS transistors 88 and 89 (first and second switching elements) as a delay circuit. Other structures are the same as those in the fifth embodiment.

The first and second constant current sources 80 and 81 charge up the first and second capacitors 82 and 83, respectively. The NMOS transistors 88 and 89 charge and discharge the first and second capacitors 82 and 83, respectively, corresponding to the first and second level-shifted pulse signals. The inverters 86 and 87 invert voltages charged in the first and second capacitors 82 and 83, respectively, and output the inverted voltages as first and second delayed pulse signals.

By this configuration, the malfunction of a power device can be prevented in the same manner as in the fifth embodiment, and the delay amount of each of ON signals and OFF signals can be controlled. Furthermore, the delay amount of signals can be easily controlled by the current values of the first and second constant current sources 80 and 81, and the capacitance values of the first and second capacitors 82 and 83.

Eighth Embodiment

Figure 13:
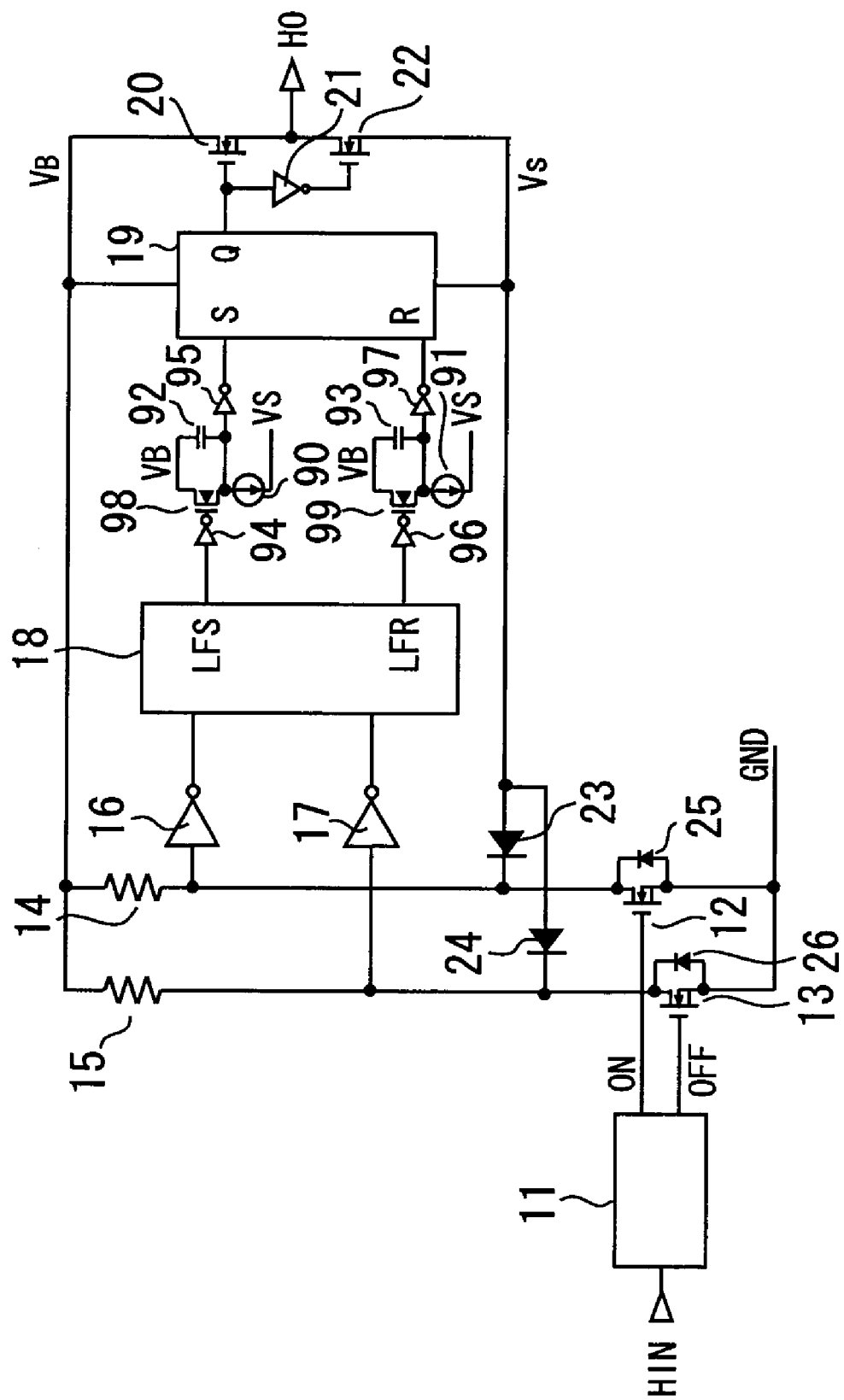
FIG. 13 is a circuit diagram showing a semiconductor device according to the eighth embodiment of the present invention.

FIG. 13 is a circuit diagram showing a semiconductor device according to the eighth embodiment of the present invention. The timing chart of the semiconductor device is the same as the timing chart for the fifth embodiment.

The eighth embodiment has first and second constant current sources 90 and 91, first and second capacitors 92 and 93, inverters 94 to 97, and NMOS transistors 98 and 99 (first and second switching elements) as a delay circuit. Other structures are the same as those in the fifth embodiment.

The first and second constant current sources 90 and 91 charge up the first and second capacitors 92 and 93, respectively. The NMOS transistors 98 and 99 charge and discharge the first and second capacitors 92 and 93, respectively, corresponding to the first and second level-shifted pulse signals. The inverters 96 and 97 invert voltages charged in the first and second capacitors 92 and 93, respectively, and output the inverted voltages as first and second delayed pulse signals.

By this configuration, the malfunction of a power device can be prevented in the same manner as in the fifth embodiment, and the delay amount of each of ON signals and OFF signals can be controlled. Furthermore, the delay amount of signals can be easily controlled by the current values of the first and second constant current sources 90 and 91, and the capacitance values of the first and second capacitors 92 and 93.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-122767, filed on May 7, 2007 including specification, claims, drawings and summary, on which the Convention priority of the present application is based, are incorporated herein by reference in its entirety.

What is claimed is:

1. A semiconductor device for driving and controlling a power device in the high-potential side of two power devices connected in series between a main power source potential of a high potential and a main power source potential of a low potential, comprising:
   a pulse generating circuit for generating first and second pulse signals corresponding to the level transition to first and second states of input signals having a first state showing the conduction of said power device in the high-potential side and a second state showing the non-conduction of said power device in the high-potential side, respectively;
   a level shift circuit for obtaining first and second level-shifted pulse signals by level-shifting said first and second pulse signals to the high-potential side;
   an SR-type flip-flop circuit inputting said first level-shifted pulse signals from set input terminal and said second level-shifted pulse signals from reset input terminal; and
   a delay circuit for delaying the output of said SR-type flip-flop circuit by at least the pulse width of said first and second pulse signals.

2. The semiconductor device according to claim 1 wherein said delay circuit has:
   a NOR circuit that inputs said first and second level-shifted pulse signals; and
   a D-type flip-flop circuit that inputs the output of said NOR circuit from clock input, and inputs the output of said SR-type flip-flop circuit from data input.

3. The semiconductor device according to claim 1 wherein said delay circuit has:
   a first inverter that inverts said first level-shifted pulse signals;
   a NAND circuit that inputs the output of said first inverter and the output of said SR-type flip-flop circuit;
   a second inverter that inverts the output of said NAND circuit; and
   an OR circuit that inputs the output of said second inverter and the second level-shifted pulse signals.

4. The semiconductor device according to claim 1 wherein said delay circuit has a plurality of inverters that delay the output of said SR-type flip-flop circuit.

5. The semiconductor device according to claim 1 wherein said delay circuit has:
   a capacitor;
   a constant current source that charge up said capacitor; and
   a switching element that charges and discharges said capacitor depending on the output of said SR-type flip-flop circuit; and outputs the voltage charged in capacitor.

6. A semiconductor device for driving and controlling a power device in the high-potential side of two power devices connected in series between a main power source potential of a high potential and a main power source potential of a low potential, comprising:
   a pulse generating circuit for generating first and second pulse signals corresponding to the level transition to first and second states of input signals having a first state showing the conduction of said power device in the high-potential side and a second state showing the non-conduction of said power device in the high-potential side, respectively;
   a level shift circuit for obtaining first and second level-shifted pulse signals by level-shifting said first and second pulse signals to the high-potential side;
   a delay circuit for delaying said first and second level-shifted pulse signals by at least the pulse width of said first and second pulse signals to obtain the first and second delayed pulse signals, respectively; and
   an SR-type flip-flop circuit inputting said first delayed pulse signals from set input terminal and said second delayed pulse signals from reset input terminal.

7. The semiconductor device according to claim 6 wherein said delay circuit has first and second capacitors supplied with said first and second level-shifted pulse signals to an end of each capacitor, respectively, and supplied with reference voltage to the other end of each capacitor; and
   outputs the voltages charged in said first and second capacitors as said first and second level-shifted pulse signals, respectively.

8. The semiconductor device according to claim 6 wherein said delay circuit has:
   a plurality of first inverters that delay said first level-shifted pulse signals, and
   a plurality of second inverters that delay said second level-shifted pulse signals.

9. The semiconductor device according to claim 6 wherein said delay circuit has:
   first and second capacitors;
   first and second constant current sources that charge up said first and second capacitors; and
   first and second switching elements that charge and discharge said first and second capacitors corresponding to said first and second level-shifted pulse signals, respectively; and
   outputs the voltages charged in said first and second capacitors as said first and second level-shifted pulse signals, respectively.

* * * * *